United States Patent
Kuhn et al.

(10) Patent No.: US 11,936,391 B2
(45) Date of Patent: Mar. 19, 2024

(54) MULTIPLYING SPREAD-SPECTRUM GENERATOR

(71) Applicant: TEXAS INSTRUMENTS INCORPORATED, Dallas, TX (US)

(72) Inventors: Ruediger Kuhn, Freising (DE); Maciej Jankowski, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/876,473

(22) Filed: Jul. 28, 2022

(65) Prior Publication Data
US 2024/0039544 A1 Feb. 1, 2024

(51) Int. Cl.
*H03L 7/099* (2006.01)
*H03L 7/087* (2006.01)

(52) U.S. Cl.
CPC .............. *H03L 7/099* (2013.01); *H03L 7/087* (2013.01); *H04B 2201/7073* (2013.01)

(58) Field of Classification Search
CPC ....... H03L 7/087; H03L 7/099; H03L 7/0331; H04B 2201/7073
USPC ................................. 331/34, 16, 78; 375/376
See application file for complete search history.

(56) References Cited

U.S. PATENT DOCUMENTS

| 2010/0214031 A1 | 8/2010 | Yamamoto et al. |
| 2018/0062661 A1 | 3/2018 | Kumar et al. |

FOREIGN PATENT DOCUMENTS

| EP | 1435694 A2 | 7/2004 | |
| EP | 1641124 A2 * | 3/2006 | ............. H03C 3/095 |

OTHER PUBLICATIONS

International Search Report in corresponding PCT Patent Application No. PCT/US2023/028915, dated Nov. 15, 2023 (4 pages).

* cited by examiner

*Primary Examiner* — Arnold M Kinkead
(74) *Attorney, Agent, or Firm* — Valerie M. Davis; Frank D. Cimino

(57) ABSTRACT

In some examples, a circuit includes a phase frequency detector (PFD) having a first input, a second input, and an output. The circuit also includes a control circuit having an input and an output, the control circuit input coupled to the output of the PFD. The circuit also includes a modulation circuit having an input and an output, the modulation circuit input coupled to the output of the control circuit. The circuit also includes an oscillator having an oscillator input and an oscillator output, the oscillator input coupled to the output of the modulation circuit and the output of the oscillator coupled to the second input of the PFD.

20 Claims, 5 Drawing Sheets

MULTIPLYING SPREAD-SPECTRUM GENERATOR

BACKGROUND

A phase-locked loop (PLL) is a circuit that provides an output signal having a phase related to a phase of an input signal of the PLL. The phase of the output signal having a relationship to the phase of the input signal causes a frequency of the output signal to have a relationship to a frequency of the input signal. For example, the output frequency is a multiple of the input frequency.

SUMMARY

In some examples, a circuit includes a phase frequency detector (PFD) having a first input, a second input, and an output. The circuit also includes a control circuit having an input and an output, the control circuit input coupled to the output of the PFD. The circuit also includes a modulation circuit having an input and an output, the modulation circuit input coupled to the output of the control circuit. The circuit also includes an oscillator having an oscillator input and an oscillator output, the oscillator input coupled to the output of the modulation circuit and the output of the oscillator coupled to the second input of the PFD.

In some examples, a PLL includes an input, an output, PFD, a control circuit, a modulation circuit, and an oscillator. The PFD is coupled to the input of the PLL and operable to provide a first control signal in response to receiving and comparing a reference signal having a reference signal frequency to a feedback signal having a feedback signal frequency. The control circuit is coupled to the PFD and operable to receive the first control signal and provide a second control signal having a current value determined based on the first control signal. The modulation circuit is coupled to the control circuit and operable to modulate the second control signal to provide a modulated control signal that varies in value within one period of the reference signal. The oscillator is coupled between the modulation circuit and the output of the PLL, the oscillator operable to provide a signal having an output frequency proportional to the value of the second control signal, wherein at a rising edge of the reference signal the second control signal has a value sufficient to cause the output frequency to equal the reference signal frequency.

In some examples, a method includes receiving a reference signal having a reference signal frequency, comparing the reference signal frequency to a frequency of a feedback signal, providing a first control signal having a value based on a result of the comparison, providing a second control signal having a value proportional to the reference signal frequency and based on the first control signal, modulating the second control signal based on a modulation signal to form a modulated control signal, and providing a signal having a frequency proportional to the modulated control signal.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
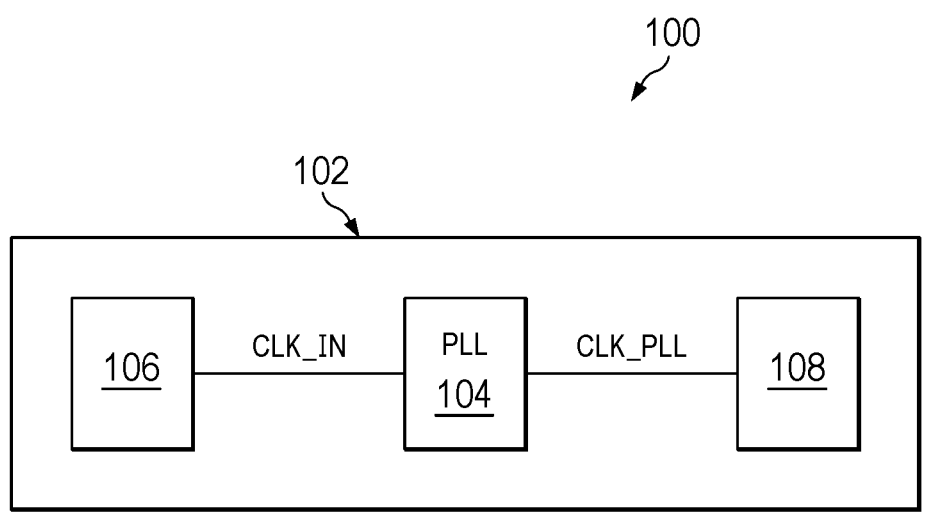
FIG. 1 is a block diagram of a system, in accordance with various examples.

A PLL may be useful in various circuits, systems, or devices in which signal synchronization is useful. For example, a PLL may be useful in clock synchronization, demodulation, frequency generation, or other use cases in application environments such as communications, digital device control (e.g., clock generation), etc. Based on a frequency (F_IN) of a received signal, such as a reference clock (CLK_IN) or other reference signal, the PLL provides an output signal having a frequency (F_PLL) that is a multiple of the F_IN.

A PLL may be useful in operation of a direct current (DC)-to-DC power converter. However, operation of a DC-to-DC power converter may create electromagnetic interference (EMI) based on a frequency of F_PLL (e.g., a switching frequency of the DC-to-DC power converter). Some use cases of a DC-to-DC power converter may be sensitive to the creation of EMI or may be subject to limits on generated EMI, such as resulting from governmental regulations, industry standards, or the like. While it may be challenging to entirely prevent EMI generation, certain techniques may reduce or otherwise mitigate the EMI. One such approach is spread spectrum clocking (SSC). SSC modulates an output signal of the PLL (CLK_PLL) to have frequencies within a predetermined range centered on F_PLL. Such modulation prevents, or mitigates, EMI concentration at F_PLL and instead distributes radiated EMI among frequencies distributed in a range around F_PLL and that have been determined based on the SSC. For limiting generated EMI to a particular amount, given a particular F_PLL, there may be an ideal or optimal modulation frequency and amplitude for the SSC modulation. In at least one application environment, this modulation frequency is approximately 120 kilohertz (kHz). Some use cases for the PLL may include boundary conditions that result in the SSC modulation frequency being outside a bandwidth of the PLL. In at least some examples, the bandwidth of the PLL is approximately one-tenth, or less, of F_IN, which may be approximately 120 kHz.

This description includes various examples of a PLL that may be configured to provide an output signal CLK_PLL that has been modulated according to a SSC modulation frequency (F_ssc) that may not be within a bandwidth of the PLL. At least some of the examples include circuitry (e.g., analog, digital, or combinations thereof) suitable for performing such modulation to provide CLK_PLL. In some examples, an amplitude of the modulation signal is not regulated by the PLL but may be insensitive to process, voltage, or temperature (PVT) changes. At least some implementations of a PLL include an oscillator. The oscillator may be de-tuned to produce frequency modulation. The de-tuning may be performed by modulating a control signal of the oscillator, such as a value of current provided to the oscillator that causes the oscillator to provide CLK_PLL. For example, the oscillator may be de-tuned according to a modulation signal (I_ssm) determined according to F_ssc, which may be an integer multiple of F_IN. The PLL may regulate F_PLL based on the average of F_PLL over one clock period of CLK_REF. In this way, CLK_PLL may be modulated according to F_ssc in positive and negative directions (such as, in an example, equal amounts in the positive and negative directions—in other words, in specific amounts more or less than F_PLL) with respect to F_PLL, with the modulation not affecting the average of F_PLL and F_ssc not being within the PLL bandwidth. As such, the modulation may be said to be invisible to the PLL.

FIG. 1 is a block diagram of a system 100 in accordance with various examples. In some implementations, the system 100 may benefit from implementation of a PLL. As such, the system 100 includes a device 102 which includes a PLL 104, a circuit 106, and a circuit 108. The device 102 may be any suitable device, such as a computer system, a router, a smartphone, a wearable device, an audio and/or video device, a component of transportation vehicle, etc. which may benefit from a PLL as described herein, such as the PLL 104. The PLL 104 may be implemented according to any suitable technology including analog and/or digital components and may be implemented in a single integrated circuit or multiple integrated circuits coupled together. Further, the PLL 104 may be implemented on a same integrated circuit as at least some components of other circuits, such as the circuit 106, the circuit 108, and/or other circuits not shown in FIG. 1. The circuit 106 provides CLK_IN to the PLL 104. In some examples, CLK_IN is received by the circuit 106 as input from another component or provided by a user and, in turn, the circuit 106 provides CLK_IN to the PLL 104. In other examples, CLK_IN is generated or otherwise provided by the circuit 106 based on one or more other signals which may be received by the system 100 from a user and/or generated by the system 100. The circuit 106 may be implemented according to any suitable technology including analog and/or digital components and may include, for example, a processor, a state machine, logic circuitry, digital circuitry, memory, analog circuitry, software and/or any combination thereof suitable for performing at least the operations or functions attributed to the circuit 106 herein. The circuit 108 receives an output signal (CLK_PLL) of the PLL 104. In some examples, the circuit 108 operates at least partially according to CLK_PLL (e.g., may be clocked according to CLK_PLL, synchronizes or otherwise processes another signal based on CLK_PLL, etc.). As described herein, CLK_PLL has a frequency F_PLL, which has a relationship, such as an integer relationship, to F_IN (which, for example, is the frequency of the received clock signal, CLK_IN). As used herein, an integer relationship between two values means that one of the values is multiplied by an integer to obtain the other value, or that one of the values is divided by an integer to obtain the other value. The circuit 108 may be implemented according to any suitable technology including analog and/or digital components and may include, for example, a processor, a state machine, logic circuitry, digital circuitry, memory, analog circuitry, software and/or any combination thereof suitable for performing at least the operations or functions attributed to the circuit 108 herein.

The PLL 104 may be operable to receive CLK_IN and manipulate CLK_IN to form a signal CLK_REF having frequency F_ref. F_ref has an integer relationship to F_IN. For example, the PLL 104 divides CLK_IN to form CLK_REF such that F_ref is a fraction of F_IN. The PLL 104 compares a frequency and phase of CLK_REF to a frequency and phase of a feedback signal having an integer relationship to CLK_PLL. Based on the comparison, the PLL 104 provides a control signal for controlling an oscillator (not shown) within the PLL 104. In at least some examples, the control signal is a current-based control signal (I_ctrl0). The control signal may be provided to a modulation circuit (not shown) within the PLL 104 that determines I_ssm based on F_ssm and CLK_IN and adds the modulation signal to I_ctrl0 to form a second control signal (I_ctrl). In at least some examples, I_ssm is expressed in terms of current. The PLL 104 controls the oscillator based on I_ctrl to provide CLK_PLL 104. In some examples, the PLL 104 further manipulates (e.g., multiplies or divides) the output signal of the oscillator prior to providing that manipulated signal as CLK_PLL.

Figure 2:
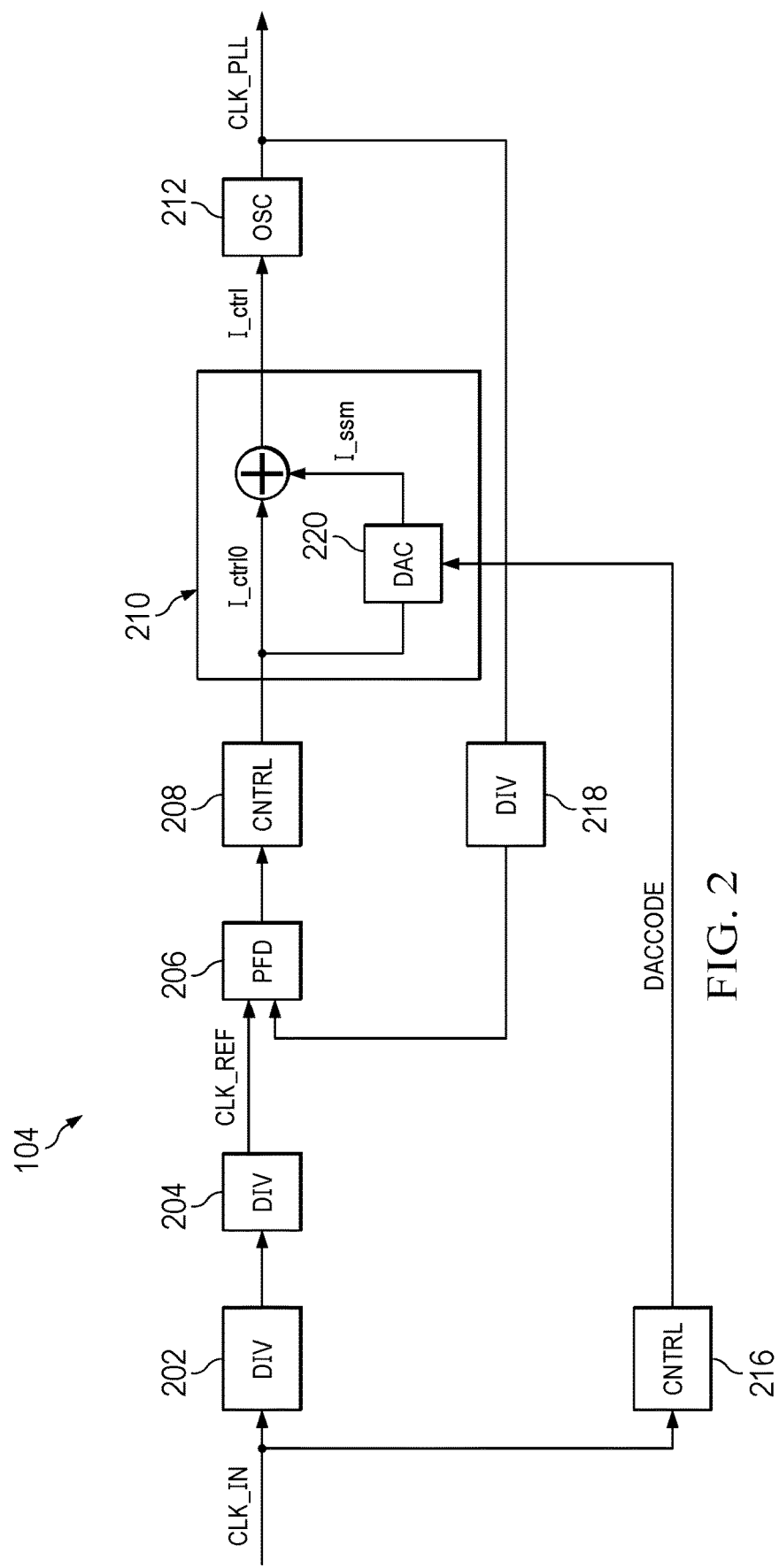
FIG. 2 is a block diagram of a PLL, in accordance with various examples.

FIG. 2 is a block diagram of the PLL 104, in accordance with various examples. The PLL 104 includes a divider 202, a divider 204, a phase frequency detector (PFD) 206, a control circuit 208, a modulation circuit 210, an oscillator 212, a control circuit 216, and a divider 218. The divider 202, divider 204, and divider 218 may be of any suitable technology including digital and/or analog components operable to divide a signal, such as to reduce a frequency of an output signal of the divider with respect to a frequency of an input signal received by the divider. The PFD 206 may be of any suitable technology including digital and/or analog components operable to receive multiple signals and compare frequency and/or phase values of the signals to determine an output value. The output value of the PFD 206 may indicate that a control signal for controlling the oscillator 212 should increase in value or should decrease in value. In examples, the control circuit 216 may be any suitable control circuit operable to receive an input signal and provide DACCODE based on the received input signal. In some examples, the input signal to the control circuit 216 is CLK_IN. The control circuit 216 may include, for example, a processor, a state machine, logic circuitry, digital circuitry, memory, analog circuitry, software and/or any combination thereof suitable for performing at least the operations or functions attributed to the control circuit 216 herein.

The control circuit 208 may be of any suitable technology including digital and/or analog components operable to receive signals and provide the control signal based on the received signals. In some examples, the control circuit 208 is implemented as, or includes, a charge pump capable of providing the control signal having a current value determined based on the output value of the PFD 206. The modulation circuit 210 may be of any suitable technology including digital and/or analog components, such as transistors, resistors, amplifiers, or the like, operable to receive the control signal from the control circuit 216 and control the oscillator 212 to provide an output signal having a frequency proportional to a value of the control signal (e.g., such as a frequency proportional to a value of a current of the control signal). The oscillator 212 may be of any suitable technology including digital and/or analog components operable to provide a signal having a frequency proportional to, or otherwise determined according to, a value of an input signal received by the oscillator 212. In some examples, the oscillator 212 has a ring oscillator architecture and/or includes a bulk acoustic wave device (BAW). In some examples, the oscillator 212 is operable to provide its output signal as CLK_PLL. In other examples, the output signal of the oscillator 212 is provided to a divider (not shown) or other circuitry that manipulates the output signal of the oscillator 212 to provide CLK_PLL. The control circuit 216 may be of any suitable technology including digital and/or analog components operable to receive an input signal of the PLL 104, or other signals, and provide digital (or other) control signals to the modulation circuit 210. For example, the digital signals may control a value of a modulation signal of the modulation circuit 210, such as by a multiplying digital-to-analog converter (DAC) 220. For example, the control circuit 216 may include a counter, such as a digital up/down counter (not shown), suitable for determining and providing DACCODE as the digital signals. The divider 218 may be coupled between the output of the oscillator 212 and an input of the PFD 206 and may be operable to provide a feedback signal to the PFD 206 that is a scaled representation (e.g., has a lower or divided frequency) of the output signal of the oscillator 212.

In an example of operation of the PLL 104, clock signal CLK_IN (having a frequency of F_IN) is received at an input of the PLL 104. In examples of the PLL 104 that include the divider 202 and the divider 204, CLK_IN is divided by the divider 202 and the divider 204 to form CLK_REF having a frequency of F_ref. In an example, the divider 202 is a divide by 2 circuit and the divider 204 is a divide by 16 circuit. Although two dividers are shown in FIG. 2, in various examples more, or fewer, dividers each having any suitable divide values may be implemented. The PFD 206 receives CLK_REF and compares CLK_REF to an output of the divider 218. Based on the comparison, PFD 206 provides a control signal to the control circuit 208. For example, responsive to F_ref being greater than a frequency of the output signal of the divider 218 the PFD 206 provides a control signal to the control circuit 208 operable to cause the control circuit 208 to increase a value of a control signal provided for controlling the oscillator 212. Similarly, responsive to F_ref being less than a frequency of the output signal of the divider 218 the PFD 206 provides a control signal to the control circuit 208 operable to cause the control circuit 208 to decrease the value of the control signal provided for controlling the oscillator 212. The PFD 206 may perform the phase and/or frequency comparison according to any suitable hardware architecture, software process, or combination thereof.

Based on the control signal provided by the PFD 206, the control circuit 208 may be operable to provide a control signal for controlling the oscillator 212. For example, the control circuit 208 may receive the output signal of the PFD 206 and provide a control signal having a value proportional to a value of the output signal of the PFD 206. In some examples, the control signal provided by the control circuit 208 has a current proportional, or otherwise related, to the value of the output signal of the PFD 206. For example, the control circuit 208 may include a charge pump of any suitable architecture that receives the output signal of the PFD 206 and provides the control signal having a current value that has a relationship to the value of the output signal of the PFD 206. The control signal provided by the control circuit 208 is indicated in FIG. 2 as I_ctrl0.

The modulation circuit 210 receives I_ctrl0 and provides current I_ctrl to the oscillator 212 based partially on I_ctrl0. For example, in various implementations, the modulation circuit 210 may be operable to modulate I_ctrl0 to create I_ctrl. The modulation of I_ctrl0, in some examples, provides for SSC, as described above herein, to mitigate the generation of EMI at harmonics of F_PLL and/or F_PLL. To modulate I_ctrl0, the DAC 220 receives DACCODE from the control circuit 216. The control circuit 216 provides DACCODE based on CLK_IN and/or F_IN according to any suitable process, the scope of which is not limited herein. For example, the control circuit 216 may determine and provide DACCODE based on a shape for the modulation, such as having values suitable to form a sine wave approximation, a triangular wave approximation, a square wave approximation, or any other suitable modulation pattern. Based on DACCODE, the DAC 220 may be operable to provide I_ssm. In some examples, I_ssm is a current having a value proportional to a value of DACCODE. The modulation circuit 210 may be operable to add I_ctrl0 and I_ssm to provide I_ctrl. In some examples, the addition is via direct coupling between outputs of the control circuit 208 and the DAC 220 (e.g., summation of currents at a node in the modulation circuit 210). In other examples, the modulation circuit 210 includes a circuit structure or component (not shown) that receives both I_ctrl0 and I_ssm and provides I_ctrl as a summation of I_ctrl0 and I_ssm.

The modulation circuit 210 provides I_ctrl to the oscillator 212. The oscillator 212 may be operable to provide an output signal having a frequency proportional to a value of I_ctrl. For example, a frequency of the output signal of the oscillator 212 may be proportional, or have another relationship, to a current value of I_ctrl. In some examples, the oscillator 212 has a ring oscillator architecture, while in other examples the oscillator 212 has any suitable architecture for providing a signal having a frequency that has a programmed or predictable relationship to a value of I_ctrl.

In some examples, the PLL 104 includes an additional divider (not shown) following the oscillator 212, so that the output signal of the oscillator 212 may be divided by the divider to form CLK_PLL having frequency F_PLL. The dividing may be by any suitable divide value based on an application environment of the PLL 104, such as a divide value of 4. The output signal of the oscillator 212 may be divided by the divider 218 to form a feedback signal for providing to the PFD 206, as described above. The divider 218 may divide by any suitable divide value based on an application environment of the PLL 104.

By controlling the generation of I_ctrl according to both I_ctrl0 and I_ssm, CLK_PLL (and, as such, F_PLL) may be modulated around a programmed or target frequency for output by the PLL 104. By modulating F_PLL, a peak value of EMI generated and/or radiated based on F_PLL may be decreased. However, based on control exerted according to DACCODE, at each rising clock edge of CLK_REF, F_PLL may have a value approximately equal to the programmed or target frequency for output by the PLL 104, causing the modulation to be effectively transparent to the PLL 104.

Figure 3:
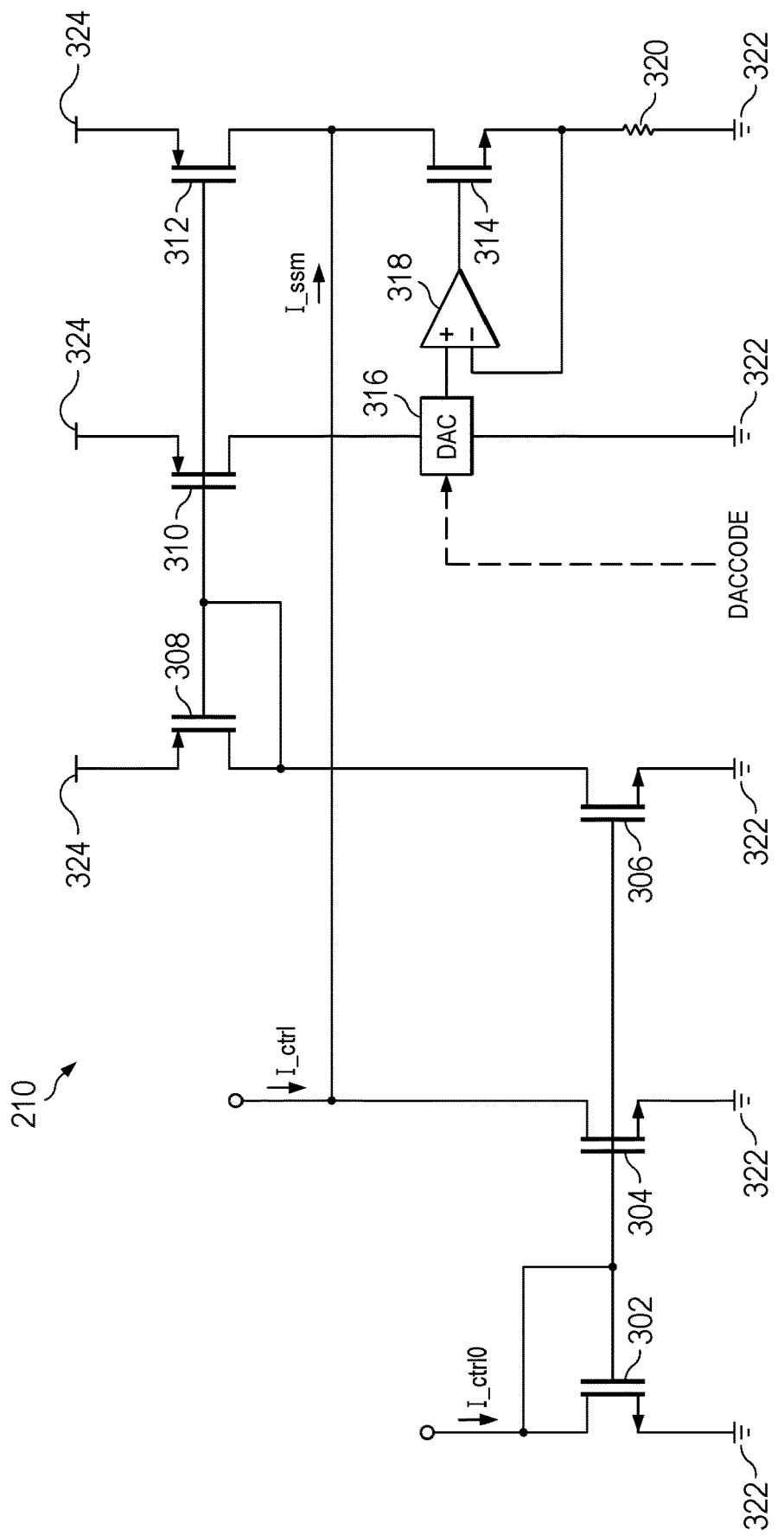
FIG. 3 is a schematic diagram of a modulation circuit, in accordance with various examples.

FIG. 3 is a schematic diagram of the modulation circuit 210, in accordance with various examples. In some examples, the modulation circuit 210 includes a transistor 302, a transistor 304, a transistor 306, a transistor 308, a transistor 310, a transistor 312, a transistor 314, a DAC 316, an amplifier 318, and a resistor 320. In some examples, at least some of the various transistors of the modulation circuit 210 are field effect transistors (FETs), such as metal oxide semiconductor FETs (MOSFETs).

In an example architecture of the modulation circuit 210, the transistor 302 is an n-channel MOSFET (nMOSFET) and has a drain operable to receive I_ctrl0 (such as by coupling to the output of the control circuit 208) and a source coupled to ground 322. The transistor 304 has a gate coupled to the gate and the drain of the transistor 302, a source coupled to ground 322, and a drain coupled to the oscillator 212 (e.g., such that I_ctrl may be provided at the drain of the transistor 304). In at least some examples, the transistor 302 and the transistor 304 form a current mirror such that a scaled amount of current flowing through the transistor 302 also flows through the transistor 304. For example, if transistors 302 and 304 are the same size (e.g., channel width and channel length), then the current flowing through transistor 302 will be equal to the current flowing through transistor 304. Otherwise, the scaled current will be proportional to the size differences of the transistors. The transistor 306 has a gate coupled to the gate of the transistor 302, a source coupled to ground 322, and a drain. In at least some examples, the transistor 302 and the transistor 306 form a current mirror such that a scaled amount of current flowing through the transistor 302 also flows through the transistor 306. The transistor 308 is a p-channel transistor (pMOSFET) and has a gate coupled to the drain of the transistor 306 and the drain of the transistor 308, and a source coupled to a power source 324. The transistor 310 has a gate coupled to the drain of the transistor 306 and the gate of transistor 308, a drain, and a source coupled to the power source 324. In at least some examples, the transistor 308 and the transistor 310 form a current mirror such that a scaled amount of current flowing through the transistor 310 is based on an amount of current flowing through the transistor 308. The transistor 312 has a gate coupled to the drain of the transistor 306, a drain, and a source coupled to the power source 324. In at least some examples, the transistor 308 and the transistor 312 form a current mirror such that a scaled amount of current flowing through the transistor 312 is based on the amount of current flowing through the transistor 308. In some examples, a ratio of the current mirror is 1:1, while in other examples the ratio is 1:X, with X related to the size difference of the transistors that form the current mirror. The transistor 314 has a gate, a drain coupled to the drain of the transistor 312, and a source.

The DAC 316 has a first terminal coupled to the drain of the transistor 312, a second terminal coupled to ground 322, a control terminal coupled to the control circuit 216, and an output terminal. The DAC 316 may be of any suitable architecture, such as a resistor DAC. The amplifier 318 has a first input terminal (such as a non-inverting input) coupled to the output terminal of the DAC 316, an output terminal coupled to the gate of the transistor 314, and a second input terminal (such as an inverting input) coupled to the source of the transistor 314. The resistor 320 is coupled between the source of the transistor 314 and ground 322. In some examples, the DAC 316, the amplifier 318, the transistor 314, and the resistor 320 collectively form the DAC 220 of FIG. 2.

In an example of operation of the modulation circuit 210, current I_ctrl0 may be received as a control signal from a PLL control loop (e.g., as an output of the control circuit 208). The modulation circuit 210, via the transistors 302, 304 and 312 mirrors (and, in some examples, scales) I_ctrl0 and provides it at the output of the modulation circuit 210 (e.g., at the drain of the transistor 304). The modulation circuit 210, via the transistors 302, 306 and 308, 310, also mirrors (and, in some examples, scales) I_ctrl0 and applies it to the DAC 316. For example, the current I_ctrl0 flows though the transistor 302 and is mirrored to flow through the transistor 306. Via their coupling, the current flowing through the transistor 306 also flows through the transistor 308. The current flowing through the transistor 308 is mirrored to flow through the transistor 310 and into the DAC 316. In some examples, the DAC 316 is a resistor ladder. For example, the DAC 316 may be a resistor ladder having 17 taps, where the resistor ladder includes multiple switches coupled between respective taps of the resistor ladder and the first input terminal of the amplifier 318. Each of these switches may be controlled according to a respective bit of DACCODE. In other examples, a number of taps of the resistor ladder, and therefore precision of the DAC 316, may correspond to a number of unique values possible based on a number of bits included in DACCODE.

Based on a value of DACCODE, the DAC 316 provides a value (e.g., a tap voltage) at the first input terminal of the amplifier 318. The amplifier 318 and transistor 314 provide the tap voltage at the source of the transistor 314 such that the voltage is provided across the resistor 320. The voltage across the resistor 320 generates the current I_ssm, which may be added to I_ctrl0 at the output of the modulation circuit 210 based on nodal summing. In some examples, the modulation circuit 210 provides I_ssm such that I_ssm has a value approximately equal to a fraction of I_ctrl0 multiplied by a value of DACCODE. As described above, combining I_ctrl0 with I_ssm facilitates modulation of the PLL 104 to mitigate the formation of EMI at F_PLL, or its harmonics, while facilitating the PLL 104 providing a signal having an average frequency of F_PLL.

For example, the oscillator 212 may be a current-controlled oscillator (CCO), as described above. I_ctrl0 may be a base current for controlling the oscillator 212 and may determine or otherwise specify or program an average CCO frequency for the oscillator 212. I_ctrl is the CCO control current derived from I_ctrl0 and I_ssm for controlling the oscillator 212. I_ssm is the modulation current, as described above, derived from I_ctrl0 and dependent on component ratios of the PLL 104 (e.g., ratios of the current mirrors of the PLL 104, as described above) and the value of DACCODE and therefore has a well-controlled amplitude. For example, I_ssm may be determined based on the below equation 1 in which K is a scaling factor determined by the size (and therefore current mirror ratio(s)) of the transistors (e.g., 302, 304, 306, 308, 310, 312) of the PLL 104.

$$I_{ssm} = K * DACCODE * I\_ctrl0 \tag{1}$$

Figure 4:
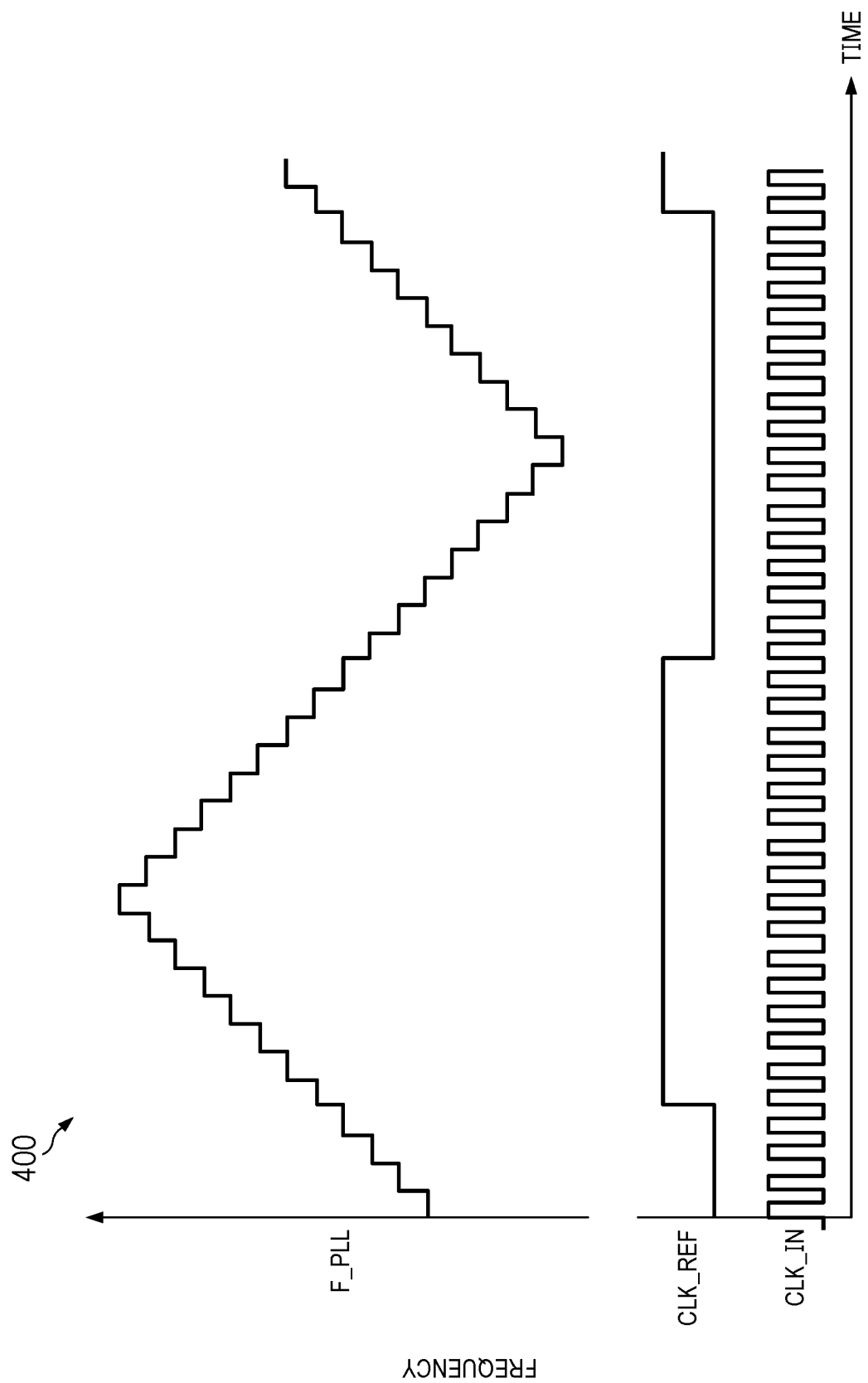
FIG. 4 is a timing diagram of signals, in accordance with various examples.

FIG. 4 is a timing diagram 400 of signals, in accordance with various examples. In at least some examples, the signals represented in the diagram 400 are signals of, or related to, the PLL 104 as described above. Accordingly, reference may be made to components or signals of the PLL 104, as described above with reference to other figures herein. The diagram 400 includes CLK_IN, CLK_REF, and F_PLL. CLK_IN and CLK_REF are shown in FIG. 4 having a horizontal axis representative of time and a vertical axis representative of voltage (e.g., binary values—logic high and logic low). F_PLL is shown in FIG. 4 having a horizontal axis representative of time and a vertical axis representative of frequency.

As shown in the diagram 400, CLK_IN may be divided to form CLK_REF. CLK_IN may be divided by 32 (e.g., divider 202 is a divide by 2 circuit and divider 204 is a divide by 16 circuit) to form CLK_REF as shown in the diagram 400, while in other examples any other suitable divisor may be used (such as based on divide values of the divider 202 and the divider 204). As further shown in the diagram 400, F_PLL may be modulated such that it may have approximately a nominal or target value at each rising edge of CLK_REF, but varies from the nominal value by +ΔF at ¼ of the period of F_PLL and varies from the nominal value by −ΔF at ¾ of the period of CLK_REF. Changes in F_PLL from the nominal value (e.g., modulation of F_PLL) may be controlled based on values of DACCODE such that F_PLL may be progressively stepped to different values at rising clock edges of CLK_IN. In this way, SSC may be implemented such that EMI generation based on F_PLL, or its harmonics, may be mitigated. While shown in the diagram 400 as having a triangular wave approximation shape and having maximum positive deviation at approximately ¼ of a period of CLK_REF and maximum negative deviation at approximately ¾ of the period of CLK_REF, in various examples F_PLL (e.g., based on a modulation pattern provided according to DACCODE) may have any other suitable shape with maximum points of positive or negative deviation at any suitable points in the period of CLK_REF.

Figure 5:
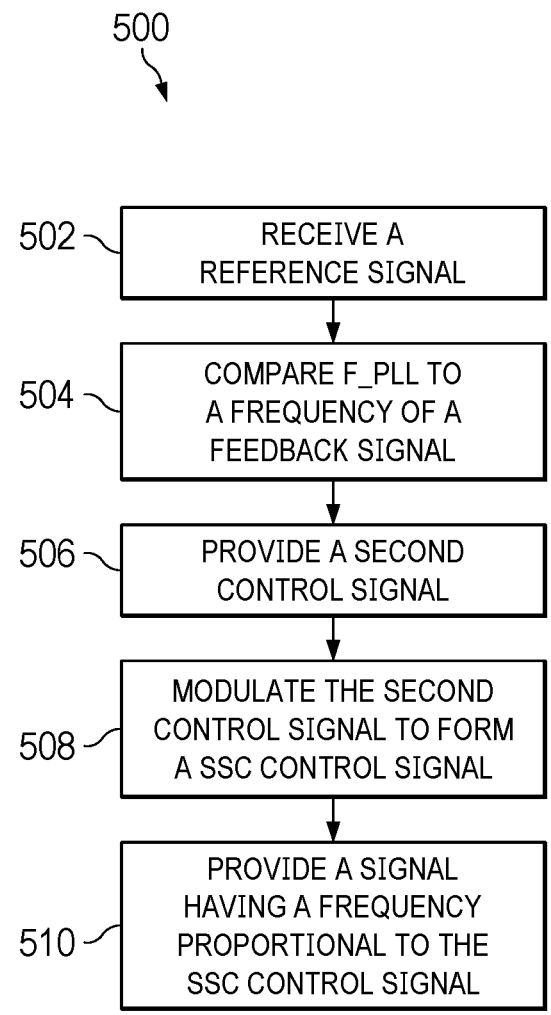
FIG. 5 is a flow diagram of a method of operation of a PLL, in accordance with various examples.

FIG. 5 is a flow diagram of a method 500 of operation of a PLL, in accordance with various examples. In at least some examples, the PLL is the PLL 104. Accordingly, reference may be made to components or signals of the PLL 104, as described above with reference to other figures herein. In some examples, the PLL is operable to provide a signal (e.g., such as a clock signal) for synchronizing operation of some other component(s). As described elsewhere herein, in some circumstances, EMI may be generated at an operating frequency of the PLL, or at various harmonics of the operating frequency. To mitigate such generation of EMI, the method 500 includes modulation of the operating frequency of the PLL to implement SSC.

At operation 502, a reference signal is received as an input signal. In some examples, the input signal is CLK_IN, as described above herein, and has a frequency of F_IN. In some examples, the input signal may be divided (to reduce a value of F_IN), forming CLK_REF with frequency F_ref.

At operation 504, F_ref is compared to a frequency of a feedback signal. In some examples, the feedback signal may be an output signal (such as CLK_PLL having a frequency F_PLL), or scaled representation of an output signal, of an oscillator of the PLL, such as the oscillator 212. The comparison may be performed, in some examples, by a PFD, such as the PFD 206. Based on the comparison, a first control signal may be provided indicating whether F_ref is greater than or lesser than the feedback signal.

At operation 506, a second control signal is provided. In some examples, the second control signal may be provided having a current or other characteristic proportional to F_PLL. Responsive to the comparison of operation 504 indicating that F_ref is greater than the feedback signal, a value of the second control signal may be increased to cause a frequency of an output signal of the oscillator to increase. Responsive to the comparison of operation 504 indicating that F_ref is lesser than the feedback signal, a value of the second control signal may be decreased to cause a frequency of the output signal of the oscillator to decrease.

At operation 508, the second control signal is modulated to form a SSC control signal. The SSC control signal, in some examples, may be modulated to increase or decrease a frequency of the output signal of the oscillator with respect to F_PLL within one period of CLK_REF. The frequency of the output signal of the oscillator is, in some examples, increased or decreased up to ΔF from F_PLL. In at least some examples, the modulation may be controlled based on DACCODE, as described above. In some implementations, operation 508 may be repeated for each received rising edge of CLK_IN.

At operation 510, a signal having a frequency proportional to the SSC control signal is provided. In some examples, the signal may instead have a frequency that has a relationship, though not proportional, to the SSC control signal. In at least some examples, the oscillator may be operable to provide the signal as an output signal of the oscillator. The modulation of the second control signal to form the SSC control signal, in some examples, mitigates the formation of EMI at F_PLL, or its harmonics, while facilitating the PLL providing a signal having an average frequency of F_PLL.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. A circuit or device that is described herein as including certain components may instead be adapted to be coupled to those components to form the described circuitry or device.

As used herein, the terms "terminal" and "node," "interconnection," "pin," "ball" and "lead" are used interchangeably. Unless specifically stated to the contrary, these terms are generally used to mean an interconnection between or a terminus of a device element, a circuit element, an integrated circuit, a device or other electronics or semiconductor component. While certain elements of the described examples are included in a circuit and other elements are external to the circuit, in other example embodiments, additional or fewer features may be incorporated into the circuit. In addition, some or all of the features illustrated as being external to the circuit may be included in the circuit and/or some features illustrated as being internal to the circuit may be incorporated outside of the circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board. While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

What is claimed is:

1. A circuit, comprising:
    a phase frequency detector (PFD) having a first input, a second input, and an output, the PFD operable to receive, at the first input, a reference signal derived from an input signal;
    a first control circuit having an input and an output, the input of the first control circuit coupled to the output of the PFD;
    a second control circuit having an input and an output, the second control circuit operable to receive the input signal at the input of the second control circuit;
    a modulation circuit having first and second inputs and an output, the first input of the modulation circuit coupled to the output of the first control circuit, the second input of the modulation circuit coupled to the output of the second control circuit; and
    an oscillator having an input and an output, the input of the oscillator coupled to the output of the modulation circuit, and the output of the oscillator coupled to the second input of the PFD.

2. The circuit of claim 1, wherein the modulation circuit includes a multiplying digital-to-analog converter (DAC).

3. The circuit of claim 2, wherein the second control circuit is operable to control the DAC to modulate a signal received by the modulation circuit to form a modulated signal.

4. The circuit of claim 3, wherein the PFD is operable to receive at the first input of the PFD the reference signal having a reference signal frequency, and to receive at the second input of the PFD a feedback signal having a feedback signal frequency, wherein the PFD is operable to compare the reference signal frequency to the feedback signal frequency to provide a first control signal, the first control signal indicating whether the reference signal frequency is greater than or less than the feedback signal frequency.

5. The circuit of claim 4, wherein the first control circuit is operable to receive the first control signal and provide a second control signal based on the first control signal, wherein the second control signal has a first value and the first value is increased responsive to the first control signal indicating that the reference signal frequency is greater than the feedback signal frequency and the first value is decreased responsive to the first control signal indicating that the reference signal frequency is lesser than the feedback signal frequency.

6. The circuit of claim 5, wherein the first value is a current of the second control signal.

7. The circuit of claim 5, wherein the modulation circuit is operable to modulate the second control signal to form a modulated signal that varies in current within one period of the reference signal to cause an output signal of the oscillator to vary in frequency within the period of the reference signal and to have a value of the reference signal frequency at each pair of rising edges of the reference signal.

8. The circuit of claim 7, wherein the modulation circuit is operable to modulate the second control signal an equal amount in positive and negative directions with respect to the reference signal during one period of the reference signal such that the output signal of the oscillator has an average frequency of the reference signal frequency for the period of the reference signal.

9. A phase-locked loop (PLL) comprising:
    an input;
    an output;
    a phase frequency detector (PFD) having a first input coupled to the input of the PLL, having a second input, and having an output, the PFD operable to provide a first control signal in response to receiving and comparing a reference signal having a reference signal frequency to a feedback signal having a feedback signal frequency;
    a first control circuit having an input coupled to the output of the PFD and having an output, the first control circuit operable to receive the first control signal and provide a second control signal having a current value determined based on the first control signal;
    a second control circuit having an input coupled to the input of the PLL and having an output;
    a modulation circuit having a first input coupled to the output of the first control circuit, having a second input coupled to the output of the second control circuit, and having an output, the modulation circuit operable to modulate the second control signal to provide a modulated control signal that varies in value within one period of the reference signal; and
    an oscillator having an input coupled to the output the modulation circuit, having an output coupled to the second input of the PLL, the oscillator operable to provide a signal having an output frequency proportional to the value of the second control signal, wherein at a rising edge of the reference signal the second control signal has a value sufficient to cause the output frequency to equal the reference signal frequency.

10. The PLL of claim 9, wherein the modulation circuit is operable to modulate the second control signal a first amount in a positive direction and a second amount in a negative direction during one period of the reference signal such that the signal has an average frequency of the reference signal frequency taken across one period of the reference signal.

11. The PLL of claim 9, wherein the first control signal indicates whether the reference signal frequency is greater than or less than the feedback signal frequency.

12. The PLL of claim 11, wherein the second control signal has a first value and the control circuit is operable to increase the first value responsive to the first control signal indicating that the reference signal frequency is greater than the feedback signal frequency and decrease the first value responsive to the first control signal indicating that the reference signal frequency is lesser than the feedback signal frequency.

13. The PLL of claim 12, wherein the first value is a current value, and wherein the modulation circuit is operable to sum the second control signal with a modulation signal to modulate the second control signal to provide the modulated control signal.

14. The PLL of claim 12, wherein the modulation circuit is operable to provide the modulated second control signal by:
    copying the second control signal to form a first copied signal;
    copying and scaling the second control signal to form a second copied signal;
    applying the second copied signal to a digital-to-analog converter (DAC) to provide the modulation signal; and
    summing the modulation signal with the first copied signal to form the modulation second control signal.

15. The PLL of claim 14, wherein the DAC is a resistor ladder having multiple taps, and wherein a selected tap of the resistor ladder determines a value of the modulation signal.

16. A method, comprising:
receiving a reference signal having a reference signal frequency, in which the reference signal is derived from an input signal;
comparing the reference signal frequency to a frequency of a feedback signal;
providing a first control signal having a value based on a result of the comparison;
providing a second control signal having a value proportional to the reference signal frequency and based on the first control signal;
modulating the second control signal based on a modulation signal to form a modulated control signal, in which the modulation signal is based on the input signal and the first control signal; and
providing a signal having a frequency proportional to the modulated control signal.

17. The method of claim 16, comprising modulating the second control signal within one period of the reference signal equal amounts in positive and negative directions.

18. The method of claim 16, comprising modulating the second control signal by summing the second control signal with the modulation signal to form the modulated control signal.

19. The method of claim 18, comprising providing a digital code to a digital-to-analog converter (DAC) to cause the DAC to provide the modulation signal, the digital code based on the input signal and varying within one period of the reference signal to cause the modulated control signal to vary in positive and negative directions during the period of the reference signal.

20. The method of claim 16, comprising providing the feedback signal based on the signal having the frequency proportional to the modulated control signal.

* * * * *